United States Patent
Farooq et al.

(10) Patent No.: US 11,791,326 B2
(45) Date of Patent: Oct. 17, 2023

(54) MEMORY AND LOGIC CHIP STACK WITH A TRANSLATOR CHIP

(71) Applicant: International Business Machines Corporation, Armonk, NY (US)

(72) Inventors: Mukta Ghate Farooq, Hopewell Jct, NY (US); Arvind Kumar, Chappaqua, NY (US); Ravi Nair, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 96 days.

(21) Appl. No.: 17/315,965

(22) Filed: May 10, 2021

(65) Prior Publication Data

US 2022/0359482 A1 Nov. 10, 2022

(51) Int. Cl.

| | |
|---|---|
| *H01L 25/18* | (2023.01) |
| *H01L 25/065* | (2023.01) |
| *H01L 23/00* | (2006.01) |
| *H01L 23/367* | (2006.01) |

(52) U.S. Cl.
CPC .......... *H01L 25/18* (2013.01); *H01L 23/3675* (2013.01); *H01L 24/05* (2013.01); *H01L 24/08* (2013.01); *H01L 25/0652* (2013.01); *H01L 25/0657* (2013.01); *H01L 2224/05147* (2013.01); *H01L 2224/08145* (2013.01); *H01L 2225/06517* (2013.01); *H01L 2225/06541* (2013.01); *H01L 2225/06589* (2013.01); *H01L 2924/1431* (2013.01); *H01L 2924/1434* (2013.01)

(58) Field of Classification Search
CPC ..... H01L 2924/1431; H01L 2924/1434; H01L 25/18; H01L 25/0657
See application file for complete search history.

(56) References Cited

U.S. PATENT DOCUMENTS

| | | |
|---|---|---|
| 8,095,735 B2 | 1/2012 | Brewer |
| 8,097,956 B2 | 1/2012 | Von Kaenel |
| 8,970,023 B2 | 3/2015 | Chou |
| 9,111,941 B2 | 8/2015 | Gong |
| 9,167,694 B2 | 10/2015 | Sundaram |

(Continued)

FOREIGN PATENT DOCUMENTS

| | | | |
|---|---|---|---|
| CN | 104520823 B | 4/2015 | |
| CN | 102870203 B * | 8/2016 | ......... H01L 23/3677 |

(Continued)

OTHER PUBLICATIONS

Business Wire, "Samsung Announces Avialability of Its Silicon-Proven 3D IC Technology for High-Performance Applications", Accessed Feb. 26, 2021, pp. 1-3, <https://www.businesswire.com/news/home/20200812005784/en/Samsung>.

(Continued)

*Primary Examiner* — Mamadou L Diallo
(74) *Attorney, Agent, or Firm* — Edward J. Wixted, III

(57) ABSTRACT

A multichip module with a vertical stack of a logic chip, a translator chip, and at least one memory chip. The multichip module includes a logic chip, a translator chip over and vertically connecting to the logic chip, and at least one memory chip above and vertically connecting to the translator chip where the translator chip is one of a chip with active devices or a passive chip.

20 Claims, 7 Drawing Sheets

(56) References Cited

U.S. PATENT DOCUMENTS

| | | |
|---|---|---|
| 9,780,072 B2 | 10/2017 | Jeng |
| 10,541,263 B2 | 1/2020 | Kim |
| 11,043,472 B1* | 6/2021 | Dokania .............. H01L 23/5389 |
| 2012/0319254 A1* | 12/2012 | Kikuchi ................ H05K 1/186 |
| | | 257/659 |
| 2013/0265071 A1* | 10/2013 | Johnson ............. G01R 31/2831 |
| | | 324/750.24 |
| 2014/0252632 A1* | 9/2014 | Barth ...................... H01L 25/18 |
| | | 257/773 |
| 2015/0206865 A1* | 7/2015 | Yu ......................... H01L 24/17 |
| | | 257/737 |
| 2015/0206866 A1* | 7/2015 | Yu ......................... H01L 24/81 |
| | | 438/109 |
| 2015/0242308 A1 | 8/2015 | Kim |
| 2016/0260690 A1* | 9/2016 | Ganesan ................ H01L 24/33 |
| 2016/0379686 A1 | 12/2016 | Burger |
| 2017/0250170 A1* | 8/2017 | Yu ......................... H01L 21/56 |
| 2018/0114786 A1 | 4/2018 | Hung-Hsin |
| 2019/0196953 A1* | 6/2019 | Gu ........................... G06F 7/00 |
| 2019/0214423 A1* | 7/2019 | Kim .................. H01L 27/14634 |
| 2020/0091215 A1* | 3/2020 | Jang ................. H01L 27/14634 |
| 2020/0212018 A1* | 7/2020 | Lai ..................... H01L 23/3121 |
| 2020/0219815 A1 | 7/2020 | Elsherbini |
| 2020/0219816 A1 | 7/2020 | Aleksov |
| 2020/0266169 A1 | 8/2020 | Kang |
| 2021/0020627 A1 | 1/2021 | Farooq |
| 2021/0066279 A1* | 3/2021 | Yu .................... H01L 23/49811 |
| 2021/0225809 A1* | 7/2021 | Yu ...................... H10B 12/315 |
| 2021/0257275 A1* | 8/2021 | Park ..................... H01L 23/3675 |
| 2021/0351124 A1* | 11/2021 | Kuo ..................... H01L 23/5383 |
| 2021/0375837 A1* | 12/2021 | Hsu ..................... H01L 25/0652 |
| 2021/0406202 A1* | 12/2021 | Malladi ............... G06F 13/1694 |
| 2022/0223531 A1* | 7/2022 | Masuda ............... H01L 23/5387 |

FOREIGN PATENT DOCUMENTS

| | | |
|---|---|---|
| CN | 107710238 A | 2/2018 |
| KR | 20150100042 A | 9/2015 |

OTHER PUBLICATIONS

Gao, et al., "Tetris: Scalable and Efficeint Neural Network Acceleration With 3D Memory", Stanford University, ASPLOS '17 Apr. 8-12, 2017, ACM ISBN 978-1-4503-4465-4/17/04, DOI: <HTTP//DX.DOI.ORG/10/1145/3037697.3037702>, pp. 1-14.

Hossen, et al., "Power Delivery Network (PDN) Modeling for Backside-PDN Configurations With Buried Power Rails and uTSVS", IEEE Transactions on Electron Devices, vol. 67, No. 1, Jan. 2020, pp. 1-7.

Kim, et al., "Neurocube: a Programmable Digital Neuromorphic Architecture With High-Density 3D Memory", IEEE Computer Society, 2016 ACM/IEEE 43rd Annual International Symposium on Computer Architecture, DOI:10.1109/ISCA.2016.41, pp. 1-13.

Schor, "Left, Right, Above, and Under: Intel 3D Packaging Tech Gains Omnidirectionality", WikiChip Fuse Chips & Semi News, May 17, 2020, pp. 1-11, <https://fuse.wikichip.org/news/3508/left-right-above-and-under-intel-3d . . . >.

* cited by examiner

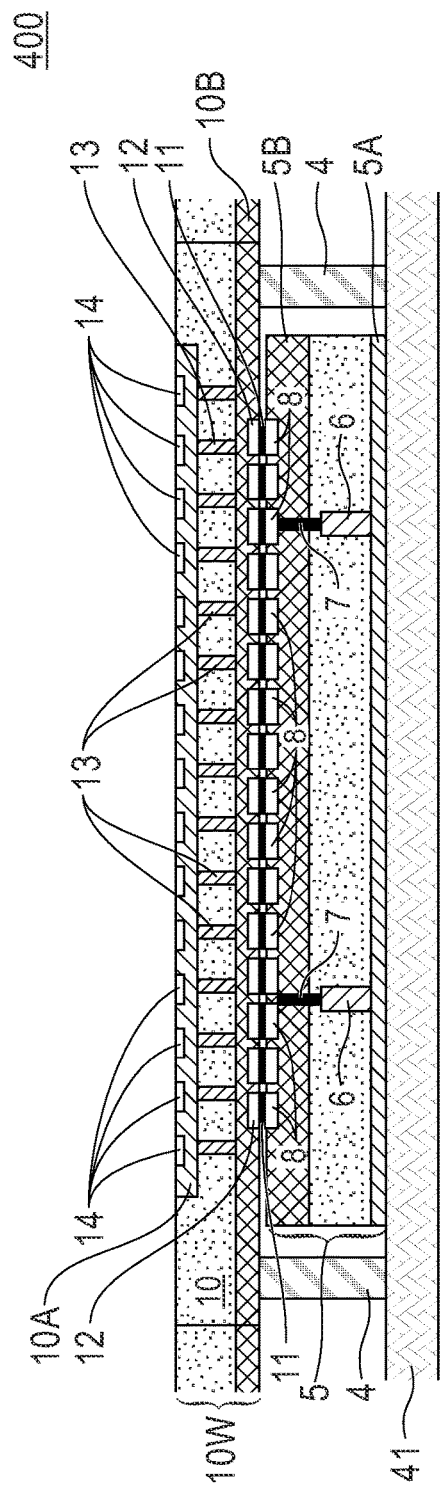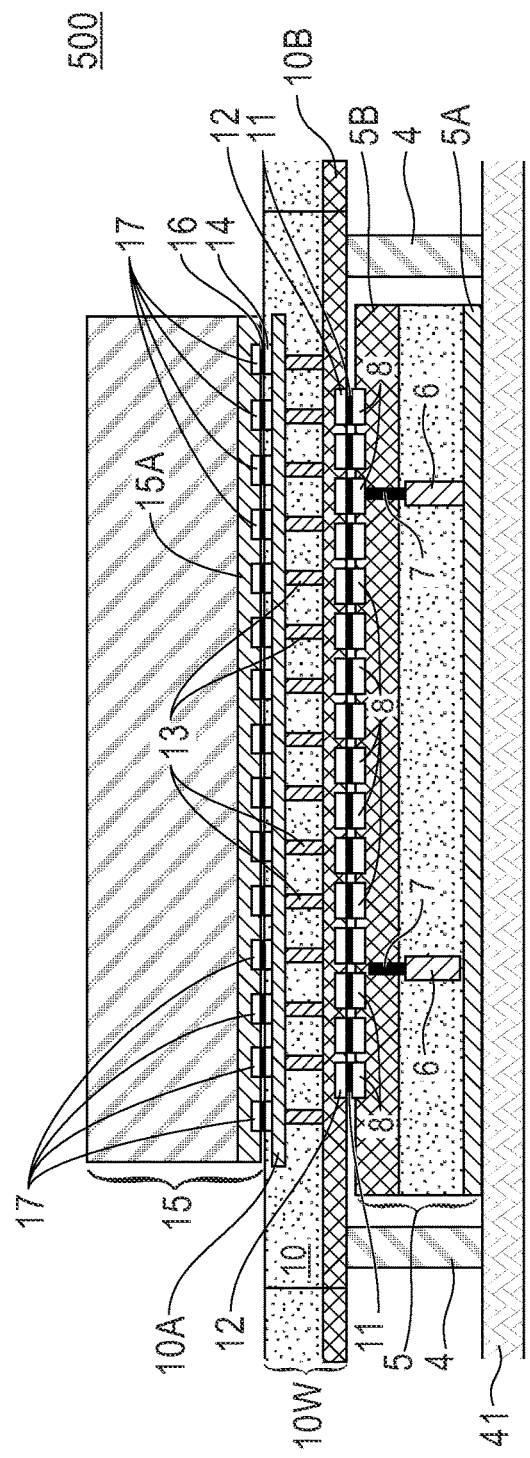
FIG. 4
FIG. 5

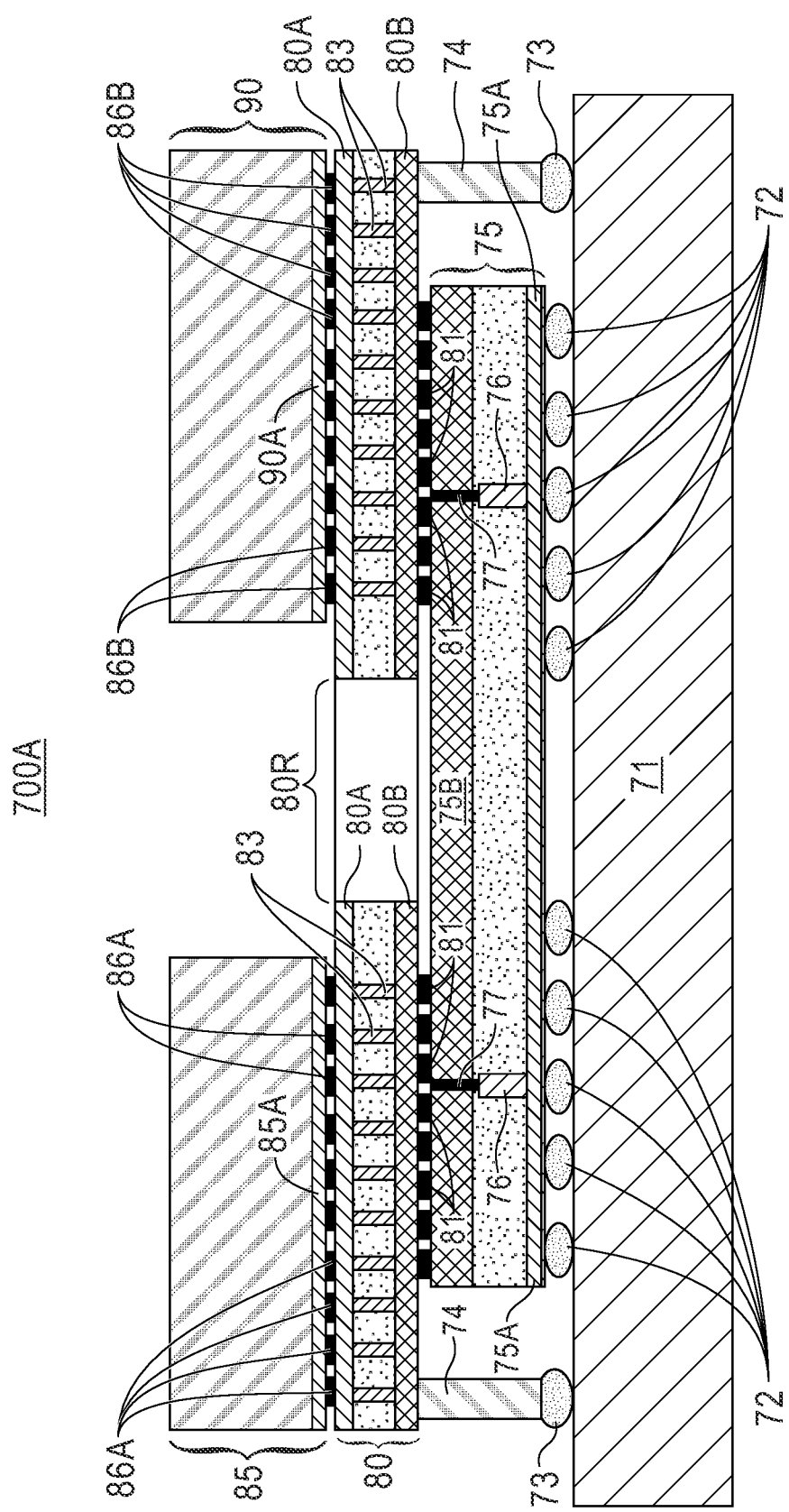

MEMORY AND LOGIC CHIP STACK WITH A TRANSLATOR CHIP

BACKGROUND OF THE INVENTION

The present invention relates generally to the field of semiconductor device technology and more particularly to stacking one or more memory chips on a translator chip above a logic chip.

Artificial intelligence is becoming pervasive in many end-use computer applications. Deep neural networks are typically used in various current artificial intelligence (AI) applications. The training and application of deep neural networks put significant demand on the memory system in the computers executing the AI with deep neural networks. Deep neural networks typically operate using many parallel and simple arithmetic operations. In conventional operation, powerful general-purpose semiconductor chips are not designed to support a high number of simple, simultaneous operations. Hardware for deep neural networks in AI applications is currently being optimized to operate with numerous specialized and less powerful chips which enable efficient parallel processing of a number of simple, simultaneous operations.

In many AI applications, there is an increasing focus on developing specific AI chips like AI accelerator chips or other microchips designed specifically to enable faster processing of artificial intelligence tasks. Increasingly, accelerator chips are being designed to provide the performance boost that device scaling once provided by changing basic assumptions about how data moves within computer systems and where data should be processed. In currently emerging accelerator chip designs, the accelerator chips employ strategies such as the use of lower precision arithmetic and optimized memory use for faster calculations that increase the throughput of computations for deep neural networks.

SUMMARY

Embodiments of the present invention provide a multi-chip module with a vertical chip stack of a logic chip, a translator chip, and at least one memory chip. The multichip module includes the translator chip that is over and vertically connecting to the logic chip, and at least one memory chip that is above and vertically connecting to the translator chip.

Embodiments of the present invention provide a method of forming a multichip module with a vertical stack of three semiconductor chips. The method includes attaching a first handler wafer to a device side of a translator wafer. The method includes joining each logic chip of a number of logic chips to each translator chip of a number of translator chips in the translator wafer and attaching a second handler wafer to a device side of the logic chips. The method further includes releasing the first handler wafer and joining each translator chip in the translator wafer to a memory chip where the device side of the memory chip joins to a device side of a translator chip with active devices. Furthermore, the method includes releasing the second handler wafer and forming solder bumps on the backside of logic chip before dicing the translator wafer into individual translator chips.

BRIEF DESCRIPTION OF THE DRAWINGS

The aspects, features, and advantages of various embodiments of the present invention will be more apparent from the following description taken in conjunction with the accompanying drawings.

FIG. 4 is a cross-sectional view of the semiconductor structure after attaching a second handler wafer to the device side of the logic chip and removing the first handler wafer on the translator chip in accordance with an embodiment of the present invention.

FIG. 5 is a cross-sectional view of the semiconductor structure after attaching a device side of the memory chip to the device side of the translator chip in accordance with an embodiment of the present invention.

FIG. 7A is a cross-sectional view of a semiconductor structure with a logic chip under a translator chip that is joined to two memory chips in accordance with an embodiment of the present invention.

DETAILED DESCRIPTION

Figure 1:
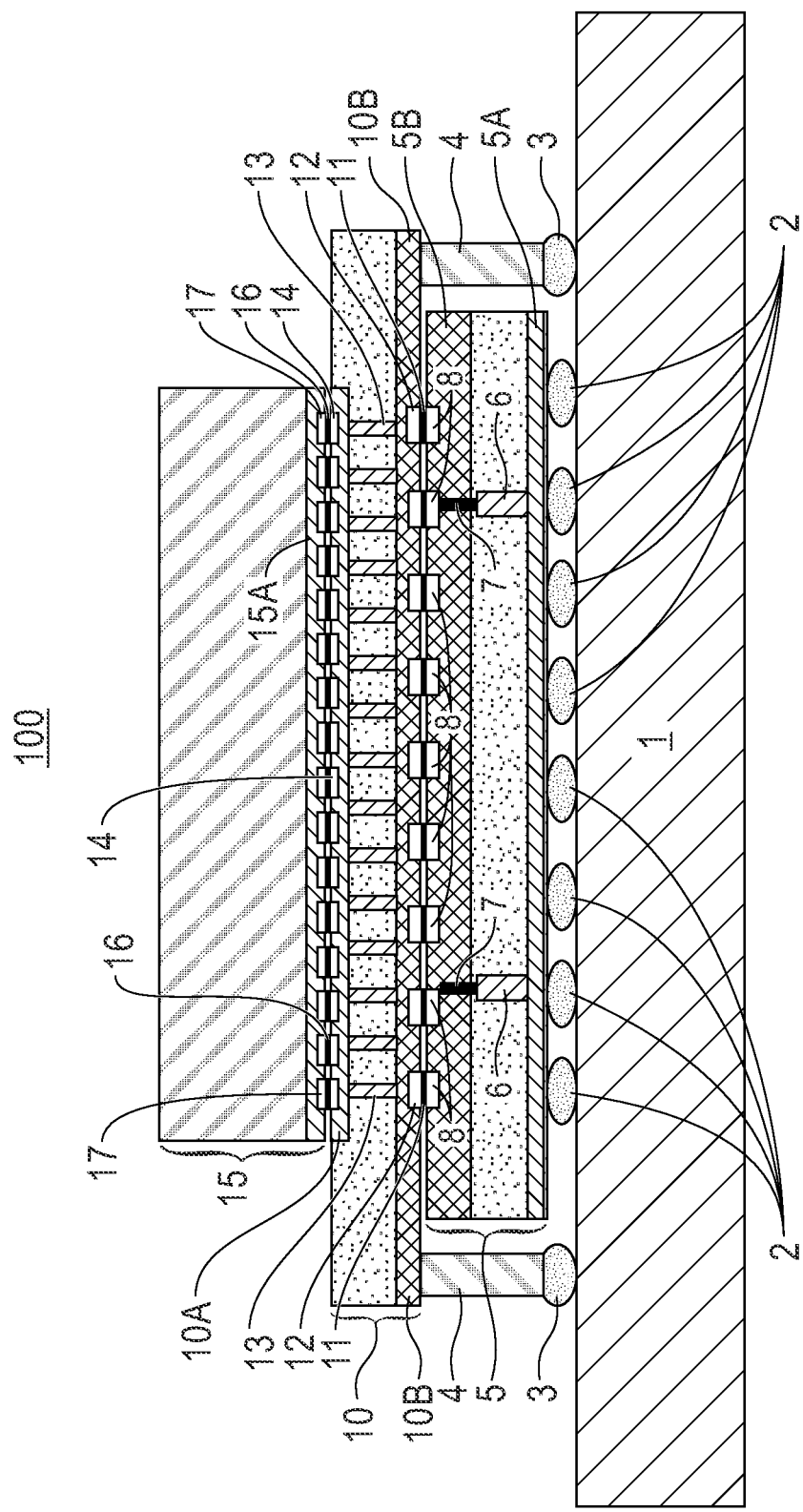
FIG. 1 is a cross-sectional view of a multi-chip semiconductor structure consisting of three vertically stacked semiconductor chips attached to a packaging substrate in accordance with an embodiment of the present invention.

Embodiments of the present invention recognize that deep neural networks (DNNs) place a significant demand on memory subsystems with growing model sizes and datasets. Embodiments of the present invention recognize that a current solution for providing high bandwidth memory includes using vertical three-dimensional memory chip stacking to achieve high bandwidth and high capacity memory. Embodiments of the present invention recognize that providing three-dimensional memory chip stacking requires energy-consuming off-chip memory access and a larger packaging form factor. Embodiments of the present invention recognize that a method of providing additional memory capability for deep neural networks without requiring energy-consuming off-chip memory access and with a smaller semiconductor chip packaging footprint is desirable. Embodiments of the present invention recognize that smaller packages can place logic and memory semiconductor chips in closer proximity especially when the logic and memory semiconductor chips can be in a single multichip module. Embodiments of the present invention recognize that placing the logic and memory semiconductor chips in close proximity improves system performance and deep neural network functionality as access to memory by logic chips can be faster when memory and logic chips are physically closer.

Embodiments of the present invention recognize that it is desirable to have data stored in memory chips close to logic chips to improve semiconductor processing speeds.

Embodiments of the present invention provide a vertical multichip chip stack for a multichip module. The vertical chip stack includes a translator chip with active devices that is between a logic chip and a memory chip. The translator chip can provide power from the packaging substrate to the memory chip using copper pillars that surround the periphery of the translator chip. The translator chip can include active devices and provides the wiring fanout from an existing logic chip, such as an accelerator chip, to an existing memory chip. The fanout in the translator chip provides wiring and/or through silicon via (TSV) connections in the translator chip to create logic chip to memory chip connections when the pitch of the devices in the logic chip and the memory chip does not match or when number of memory controllers in the logic chip does not match the pitch or the number of memory controllers in the memory chip. Using a translator chip between the logic chip and one or more memory chips stacked directly above the logic chip prevents a need for re-design of the logic chip or the memory chip. Additionally, using a translator chip allows the use of different memory chips using different memory technologies with the existing logic chip with only a re-design of the wiring fanout in the translator chip. In some cases, using a translator chip allows the use of different memory chips requires a both new fanout in the translator chip and the change of memory controller locations on the translator chip if the translator chip is an active chip (i.e., prevents a re-design of the memory chip).

Embodiments of the present invention provide a translator chip that is either a passive translator chip or a translator chip with active devices. A passive translator chip provides TSVs and wiring or signal fanout to the top side of the translator chip and power from a packaging substrate to the memory chip through copper pillars formed on the periphery of the translator chip. An active translator chip provides some semiconductor devices such as memory controllers formed in the translator chip along with the fanout wiring for signals and the peripheral pillars for distribution of power from a packaging substrate to power to the memory chip. An active translator chip can provide additional processing capability to the logic chip or can reduce the required number of semiconductor devices required in the logic chip, such as memory controllers. Using a large number of memory controllers in an accelerator chip disrupts the function of the semiconductor intellectual property or re-usable logic cells in the logic chip. Embodiments of the present invention provide a way to reduce the number of memory controllers in the accelerator chip by providing some memory controllers in the translator chip.

Embodiments of the present invention provide a vertical stack of semiconductor chips on a packaging substrate where the vertical stack of semiconductor chips includes a logic chip attached to the packaging substrate and to the translator chip. The logic chip can be attached to the translator chip in a translator wafer using die to wafer bonding of the backside of the logic chip to the backside of the translator chip in a translator wafer. TSVs and vias in the logic chip route signals through the logic chip while TSVs in the translator chip route signals and power vertically through the translator chip to the memory chip attached above the translator chip. The vertical stack of semiconductor chips is assembled using a translator wafer with a number of translator chips. After assembling the vertical stack of semiconductor chips, the translator wafer is diced to form a number of multichip modules. Embodiments of the present invention provide a multichip module with a logic chip under a translator chip and a memory chip above the translator chip after dicing the translator wafer. Embodiments of the present invention also provide a multichip module with a logic chip that is under two translator chips and each translator chip is under a memory chip. Furthermore, embodiments of the present invention include a multichip module with a logic chip under a translator chip with two memory chips over the translator chip. Embodiments of the present invention include a multichip module with more than one logic chip under a translator chip with one or two memory chips over the translator chip Embodiments of the present invention provide power from the packaging substrate to the memory chip through the copper pillars on the outer edges of the translator chip. Providing power to the memory chip through the translator chip frees up wiring channels and semiconductor device real-estate in the logic chip that would normally be needed to provide power to the memory chip. Additionally, the packaging substrate provides power directly to the logic chip through solder connections or controlled collapse chip connections under the logic chip.

Embodiments of the present invention provide a vertically stacked semiconductor structure capable of attaching more than one memory chip to the translator chip that is above a logic chip. Embodiments of the present invention provide chip interconnect pads on the device side of the memory chip bonded to the device side of the translator chip The vertical stack of a logic chip directly under the translator chip that is directly under a memory chip provides a compact semiconductor package or multichip module with short, nearly direct connections between a logic chip, such as an accelerator chip and a memory chip using a translator chip for fast, efficient processing and data access.

Embodiments of the present invention provide a method of forming a multichip module that includes attaching a first handler wafer to the translator wafer. Die to wafer connections attach the logic chip to each translator chip in a translator wafer. The die to wafer connections between the logic chip that is under a translator chip in the translator wafer occur using chip interconnect pads and/or controlled collapse chip connections. During the assembly of the multichip module, attaching a number of logic chips to the translator wafer forms a reconstituted wafer. As known to one skilled in the art, a reconstituted wafer is a wafer or a portion of a wafer with one or more diced chips attached to the wafer or the portion of the wafer. During assembly of the logic chip to the translator wafer and the assembly of the memory chip to the translator wafer, the translator wafer can be one of a wafer with any number of translator chips or a portion of a wafer with one or more translator chips.

After attaching the logic chip to the translator chip in the translator wafer, a second handler wafer is attached to the device side of the logic chip and the first handler wafer is released. A known good memory chip is joined to the translator chip using die to wafer connections. The die to wafer connections join the device side of the memory chip to the device side of the translator chip.

The joining of the logic chip to the translator chip and the joining of the translator chip to the memory chip can occur using die to wafer bonding processes or chip to chip bonding processes including one of copper interconnect pad to copper interconnect pad thermal compression bonding, hybrid copper bonding, or C4 reflow. After attaching the memory chip to the translator chip, the second handler wafer is released and solder connections or bumps, such as controlled collapse chip connections are formed on the exposed device side of the logic chip. The translator wafer can be diced to form individual translator chips. Each of the diced translator chips includes at least one memory chip above the translator chip and a logic chip under the translator chip. Chip underfill can be applied beneath the logic and/or memory chip. The vertical stack of chips can form an MCM that can be attached to a packaging substrate using the solder connections under the logic chip. Additionally, embodiments of the present invention provide a way for heat to escape from the logic chip to the lid and heatsink through the extra TSVs in the translator chip.

Using this method, a vertically stacked semiconductor structure with one or more than one known good memory chip can form a multichip module. Embodiments of the present invention provide both a vertically stacked semiconductor structure with a single memory chip on the translator chip or more than one horizontally aligned memory chip on the translator chip that is above a logic chip.

Detailed embodiments of the claimed structures and methods are disclosed herein. The method described below does not form a complete process flow for manufacturing integrated circuits, such as semiconductor devices. The present embodiments can be practiced in conjunction with the integrated circuit fabrication techniques currently used in the art, for semiconductor devices, and only so much of the commonly practiced process steps are included as are necessary for an understanding of the described embodiments. The figures represent cross-section portions of a vertical stack of semiconductor chips that are joined by various chip to chip joining methods. The figures are not drawn to scale but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment", etc., indicate that the embodiment described may include a particular feature, structure, or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "over", "on", "positioned on" or "positioned atop" mean that a first element is present on a second element wherein intervening elements, such as an interface structure, may be present between the first element and the second element. The term "direct contact" means that a first element and a second element are connected without any intermediary conducting, insulating, or semiconductor layers at the interface of the two elements.

In the interest of not obscuring the presentation of the embodiments of the present invention, in the following detailed description, some of the processing steps, materials, or operations that are known in the art may have been combined for presentation and illustration purposes and in some instances may not have been described in detail. Additionally, for brevity and maintaining a focus on distinctive features of elements of the present invention, description of previously discussed materials, processes, and structures may not be repeated with regard to subsequent Figures. In other instances, some processing steps or operations that are known may not be described. It should be understood that the following description is rather focused on the distinctive features or elements of the various embodiments of the present invention.

FIG. 1 is a cross-sectional view of multichip structure 100 consisting of three vertically stacked semiconductor chips attached to packaging substrate 1 in accordance with an embodiment of the present invention. As depicted, FIG. 1 includes memory chip 15, translator chip 10 with pillars 4 and TSVs 13, logic chip 5 with TSVs 6, vias 7, interconnect pads 17 on device side 15A of memory chip 15 with connections 16 to interconnect pads 14 on the device side 10A of translator chip 10, interconnect pads 12 on backside 10B of translator chip 10 with connections 11 to interconnect pads 8 on backside 5B of logic chip 5, and solder connections 2 under logic chip 5 connecting device side 5A to packaging substrate 1, and solder connections 3 joining pillar 4 on backside 10B of translator chip 10 to packaging substrate 1. The vertical stack of memory chip 15, translator chip 10, and logic chip 5 depicted in multichip structure 100 form a multichip module (MCM) that is joined to packaging substrate 1 by solder connections 2 and 3. The MCM depicted in FIG. 1 is joined by solder connections 2 and 3 to packaging substrate 1. In various embodiments, packaging substrate 1 is one of an organic packaging substrate or an inorganic packaging substrate (e.g., ceramic packaging substrate). For example, packaging substrate 1 can be a laminate packaging substrate formed using epoxy glass or polyimide with metal layers or a printed circuit board.

Logic chip 5 can be any type of semiconductor logic chip. In various embodiments, logic chip 5 is an accelerator chip. Logic chip 5 is not limited to an accelerator chip used for AI applications but, can also be another type of application-specific integrated circuit (ASIC) chip, a complementary metal-oxide-semiconductor (CMOS) chip, or any other type of semiconductor logic chip with active semiconductor devices. As depicted in FIG. 1, logic chip 5 connects to packaging substrate 1 through solder connections 2 that can provide power from packaging substrate 1 directly to logic chip 5. Logic chip 5 includes chip interconnect pads (not depicted in FIG. 1) that are under a portion of the bottom surface of device side 5A of logic chip 5 and directly contact solder connections 2.

As depicted, logic chip 5 includes device side 5A of logic chip 5 which may include the active semiconductor devices formed in logic chip 5, TSVs 6 connecting the active semiconductor devices formed in the active area of device side 5A of logic chip 5 to vias 7 that extend through the redistribution wiring layers of backside 5B of logic chip 5 to interconnect pads 8. The thickness of logic chip 5 can range from 50 to 60 um but is not limited to this thickness. The typical size of logic chip 5 can range from 15 to 20 mm on a side but is not limited to these sizes.

TSVs 6 and vias 7 feed signals to and from packaging substrate 1 through logic chip 5 to translator chip 10 which, then, transmits the signals to memory chip 15 through TSVs 13, fanout wiring, and connections 16. While FIG. 1 depicts two TSVs 6 and vias 7, in other examples, any number of TSVs 6 and vias 7 can be present in logic chip 5. TSVs 6 can be 50 um by 50 um but, are not limited to this size and may be smaller, larger, or longer in other examples. TSVs 6 and vias 7 are not used to provide power to memory chip 15. Power can be provided to memory chip 15 through translator chip 10 using pillars 4 surrounding the periphery of translator chip 10. Power can be provided directly to logic chip 5, such as an accelerator chip from packaging substrate 1 through solder connections 2 and to memory chip 15 using pillars 4 and TSVs 13 in translator chip 10. Through-silicon vias use semiconductor real estate in semiconductor chips and block some of the available wiring area in logic chip 5. Reducing the number of TSVs 6 by distributing power to memory chip 15 through translator chip 10 increases wiring area in logic chip 5 for circuits and semiconductor devices. By providing power to memory chip 15 through pillars 4 on the periphery of translator chip 10, the available wiring area in logic chip 5 may be increased.

Solder connections 2 can connect logic chip 5 to packaging substrate 1. Solder connections 2 can be controlled collapse chip connections, also known as a C4s, that can be reflowed to join logic chip 5 to packaging substrate 1. Solder connections 2 can also be formed from deposited and solder reflowed solder bumps on logic chip 5, from a reflowed, screened solder paste on packaging substrate 1, from a screened and reflowed solder paste on packaging substrate 1 connecting to C4s on logic chip 5, or in some cases, from a conductive adhesive forming an electrical connection between logic chip 5 and packaging substrate 1.

As known to one skilled in the art, C4's can be deposited on logic chip 5 during semiconductor manufacturing processes. Solder connections 2 can be formed using any known lead-free solder or lead-free solder alloys, such as a tin (Sn) silver (Ag) alloy, containing less than 3% Ag, but, is not limited to this alloy or composition. Solder connections 2, such as C4s can be formed on logic chip 5 by the ball drop method where the ball drop method uses a stencil and a ball dispense unit to place solder balls on logic chip 5 for subsequent solder reflow processes to form C4's and then, reflowed to form solder connections 2 to packaging substrate 1. For example, solder connections 2 joining logic chip 5 to packaging substrate 1 can be formed using C4s with a 60 to 80 um height and with a 150 um pitch between adjacent C4s. Solder connections 2 are not limited to these sizes and pitch. In other examples, solder bumps or C4s can be formed by electroplating or controlled solder paste deposition and solder reflow that may be followed by a solder paste screening on packaging substrate 1 to create solder connections 2. Solder connections 2 can be composed of any conductive material used in semiconductor chip join to a packaging substrate.

In various embodiments, logic chip 5 includes interconnect pads 8 on the grind side or backside 5B of logic chip 5. Interconnect pads 8 on backside 5B of logic chip 5 use connections 11 to join interconnect pads 8 on logic chip 5 to interconnect pads 12 on backside 10B of translator chip 10.

Interconnect pads 8 on logic chip 5, interconnect pads 12 and 14 on translator chip 10, and interconnect pads 17 on memory chip 15 may all be formed with known semiconductor chip processes for creating chip contact pads used to interconnect with the next level of semiconductor packaging (e.g., packaging substrate 1). As depicted, interconnect pads 8, 12, 14, and 17 can be copper pads formed on logic chip 5, on translator chip 10, and on device side 15A of memory chip 15, respectively. In some embodiments, copper pads for interconnect pads 8, 12, 14, and 17 may be formed over a diffusion barrier or a thin layer of Ti, TiW, W, or other known semiconductor barrier layer material but, interconnect pads 8, 10, 12, and 17 are not limited to these materials.

As depicted, connections 11 join logic chip 5 to translator chip 10. Connections 11 can be formed as die to wafer connections where a diced and thinned logic chip 5 can be joined to translator chip 10 in a wafer as discussed in detail later with respect to FIG. 3. In various embodiments, translator chip 10 is in a wafer or in a portion of a wafer during the joining of logic chip 5 to translator chip 10. In one embodiment, translator chip 10 is a diced die, and connections 11 are formed as die to die connections. In one embodiment, more than one logic chip 5 is attached to translator chip 10 in a wafer. In an embodiment, one or more passive devices are joined to translator chip 10 along with logic chip 5.

Similarly, connections 16 can be formed as die to wafer connections where a diced, known good memory chip 15 can be joined to translator chip 10 that is in a wafer. For example, connections 11 and connections 16 can be 8 to 10 um in size or diameter on a 20 um pitch but, are not limited to these dimensions. Connections 11 can be connections for signals from logic chip 5 to translator chip 10 and connections 16 can be either a power or a signal connection from translator chip 10 to memory chip 15.

In various embodiments, each of connections 11 between logic chip 5 and translator chip 10 and connections 16 between translator chip 10 and memory chip 15 are formed using known semiconductor die to wafer or die to die bonding processes. For example, connections 11 and connections 16 can be one of C4 connections, copper to copper connections, or a copper hybrid connection formed using thermal compression bonding of oxides and copper on each of the bonding surfaces. As known to one skilled in the art, the reflow of lead-free solder bumps or C4 balls can form C4 connections between logic chip 5 and translator chip 10 and/or between translator chip 10 and memory chip 15 in some embodiments. Thermal compression bonding of copper interconnect pads 8 on logic chip 5 to copper interconnect pads 12 on translator chip 10 can form copper to copper connections between logic chip 5 and translator chip 10 in other embodiments. Similarly, C4s or copper interconnect pads 14 on translator chip 10 and copper interconnect pads 17 on memory chip 15 can form connections 16 between translator chip 10 and memory chip 15. In other examples, copper hybrid connections for connections 11 between logic chip 5 and translator chip 10 and/or for connections 16 between translator chip 10 and memory chip 15 may be formed using thermal compression bonding of copper interconnect pads with oxides using a copper hybrid bonding process (e.g., between copper interconnect pads 8 and 12 and/or between copper interconnect pads 14 and 17 with oxides, respectively). In some embodiments, a die underfill material is used under one or more of logic chip 5, between logic chip 5 and translator chip 10, and between translator chip 10 and memory chip 15. The underfill may be one of a known epoxy underfill material, a non-conductive film, or a non-conductive paste for chip underfill.

Translator chip 10 with TSVs 13 can be an active semiconductor chip or a passive semiconductor chip. In various embodiments, when translator chip 10 is an active semiconductor chip, semiconductor devices, such as memory controllers, are formed in the active device area depicted in device side 10A of translator chip 10. Forming memory controllers in translator chip 10 removes or reduces the need for multiple memory controllers in logic chip 5 and provides more semiconductor circuit space for semiconductor intellectual property (IP) core or logic, cell in logic chip 5.

Additionally, pillars 4 on translator chip 10 connect directly to power in packaging substrate 1 and provide power to memory chip 15 through translator chip 10 thus, alleviating the need for logic chip 5 to use TSVs, wiring, and vias to provide power to memory chip 15 (e.g., leaves more semiconductor area in logic chip 5 for logic devices, wiring, etc.).

Figure 8:
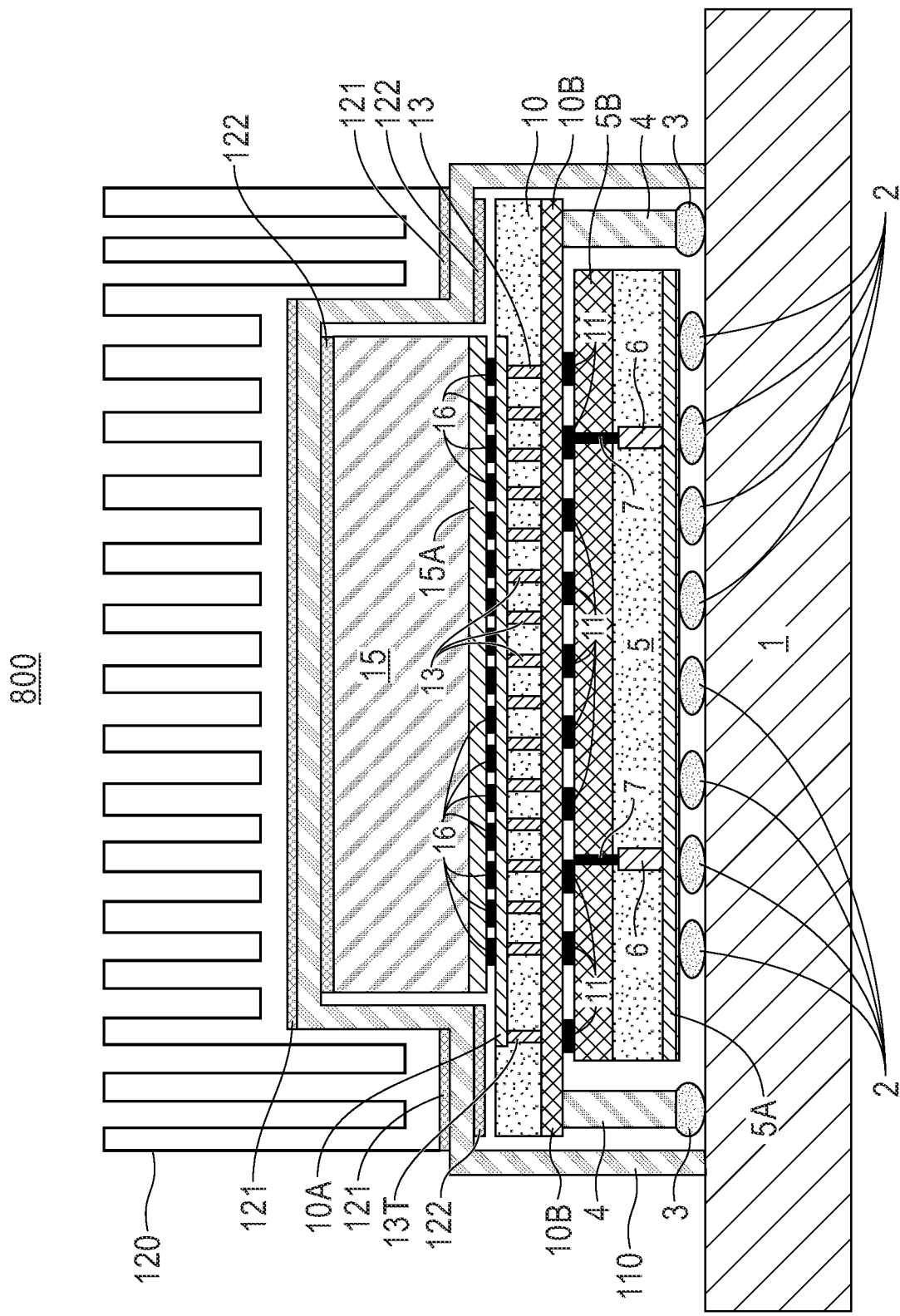
FIG. 8 is a cross-sectional view of the multi-chip semiconductor structure on a packaging substrate with a lid and a heat sink covering the multi-chip semiconductor structure in accordance with an embodiment of the present invention.

Translator chip 10 includes pillars 4, fanout wiring (not depicted) in backside 10B, and TSVs 13 in translator chip 10. In various embodiments, translator chip 10 provides power from packaging substrate to memory chip 15 using pillars 4 and TSVs 13 and in some cases, also utilizing fanout wiring. TSVs 13 in translator chip 10 can range from 5 to 10 um diameter with a 20 um pitch but may be larger or smaller in some applications and have a different pitch. For example, TSVs 13 may be 5 um wide with a 50 um height or may be 10 um wide with a 100 um height. In some embodiments, additional TSVs for thermal transfer are present in translator chip 10 outside of the area where connections to memory chip 15 occur. These additional TSVs for thermal transfer can be used to provide an extra path for the release of thermal energy from logic chip 5 through translator chip 10 to a top surface of translator chip 10. The top surface of translator chip 10 may connect to a heatsink using a thermal interface material as depicted in FIG. 8.

Utilizing the fanout wiring, TSVs 13 can provide connections between interconnect pads 12 on backside 10B of translator chip 10 to active devices in device side 10A of translator chip 10 (when translator chip 10 is an active chip) and to connections 16. The fanout wiring and TSVs 13 in translator chip 10 provide an ability to connect memory devices, such as memory controllers residing in memory chip 15 that have a different pitch and with a different number of memory controllers to logic chip 5, such as an accelerator chip, without a re-design of logic chip 5.

In this way, different high-density memory chips 15 with different characteristics can be joined to logic chip 5 with only a re-design of the fanout wiring in the translator chip 10 (e.g., re-design of logic chip 5 or memory chip 15 is not required). For example, a dynamic random access memory (DRAM) memory chip as memory chip 15 with forty-eight to sixty-four memory controllers is desired to work with and be attached to a larger accelerator chip with twenty-five to thirty-five cores in logic chip 5 without requiring a re-design of the accelerator chip or the DRAM chip. Using translator chip 10 in the present invention, the DRAM chip can be stacked on the accelerator chip using the fanout wiring and TSV's 13 in translator chip 10 to accommodate pitch differences, different number of memory controllers, and size differences between the DRAM chip and the accelerator chip without re-design of either of the accelerator chip or the DRAM chip.

In various embodiments, translator chip 10 is larger than either logic chip 5 or memory chip 10. One or more rows of pillar 4 surround the periphery or outside edges of translator chip 10 to provide power from packaging substrate 1 to memory chip 15 (e.g., power is not supplied to memory chip 15 through logic chip 5). Pillars 4 can be copper posts or pillars with a 40 um to 130 um height and 30 to 90 um diameter. Pillars 4 may have a different height and/or diameter in other examples. In an embodiment, pillars 4 are composed of a solder material, a gold material, a gold alloys, a silver material, a silver alloy, tungsten, a tungsten alloy, ruthenium, nickel, a nickel alloy, or a metal nitride. Pillar 4 may be formed using photolithography and electroplating, for example, along the outer edges of translator chip 10 connecting to backside 10B of translator chip 10. Solder connections 3 can join pillars 4 on translator chip 10 to packaging substrate 1. Solder connections 3 can be formed with any known lead-free solder used in package assembly processes. For example, a tin-copper alloy solder, a tin-copper-nickel, germanium solder, or any other lead-free solder alloy with a melting temperature suitable for packaging assembly processes can be used for solder connections 3. For example, a lead-free solder paste can be screened on packaging substrate 1 and reflowed to form solder connections 3.

Memory chip 15 can be any type of memory chip. For example, memory chip 15 can be a DRAM memory chip, phase change memory (PCM) chip, a magnetoresistive random access memory (MRAM) chip, a resistive random access (RRAM) chip, or another type of memory chip. As depicted in FIG. 1, memory chip 15 is joined face to face to translator chip 10 or device side 15A of memory chip 15 to device side 10A of translator chip 10 with connection 16. As previously discussed, die to wafer bonding may create connections 16 between memory chip 15 and translator chip 10 that is in a wafer. While FIG. 1 depicts one memory chip 15 joining to translator chip 10, in other embodiments, more than one memory chip 15 is bonded to translator chip 10.

Figure 7B:
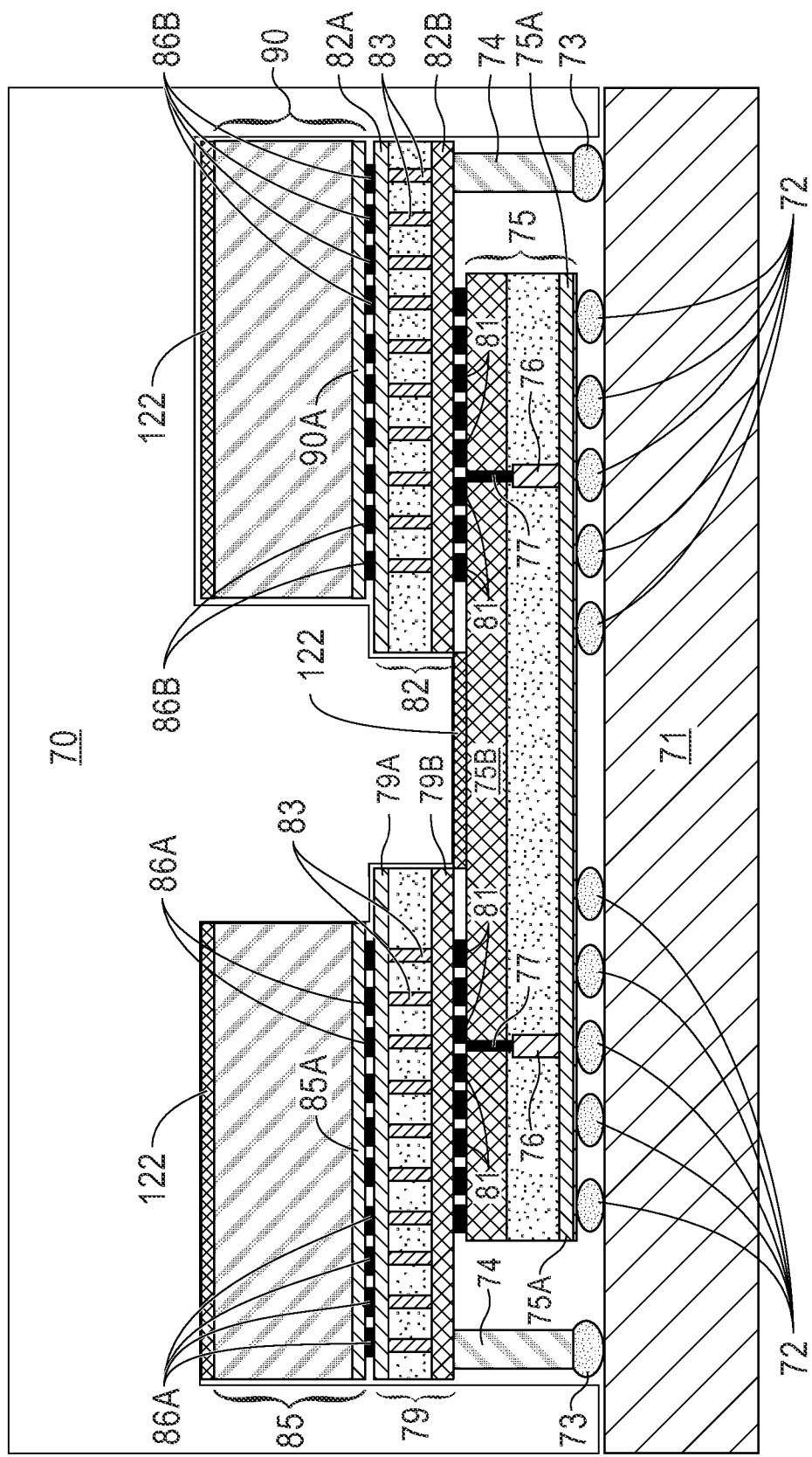
FIG. 7B is a cross-sectional view of a semiconductor structure with a first translator chip over a logic chip and under a memory chip and a second translator chip over the logic chip and under a second memory chip in accordance with an embodiment of the present invention.

An ability to stack a DRAM chip, PCM chips, or another type of memory chip, directly above logic chip 5, which may be an accelerator chip, can provide desired high-bandwidth and low-energy connectivity between one or more memory chips 15 and logic chip 5. As depicted in FIGS. 7A and 7B, more than one horizontally placed memory chip can reside on translator chip 10 directly above logic chip 5. The ability to tightly couple or place memory chip 15 and logic chip 5 in close if not almost immediate proximity is desirable for improving processing speeds (e.g., processing instructions near memory). Additionally, an ability to place memory chip 15 directly above logic chip 5 using translator chip 10 allows different types of memory to be used with logic chip 5 with only a change in translator chip 10 fanout wiring and TSVs.

Figure 2:
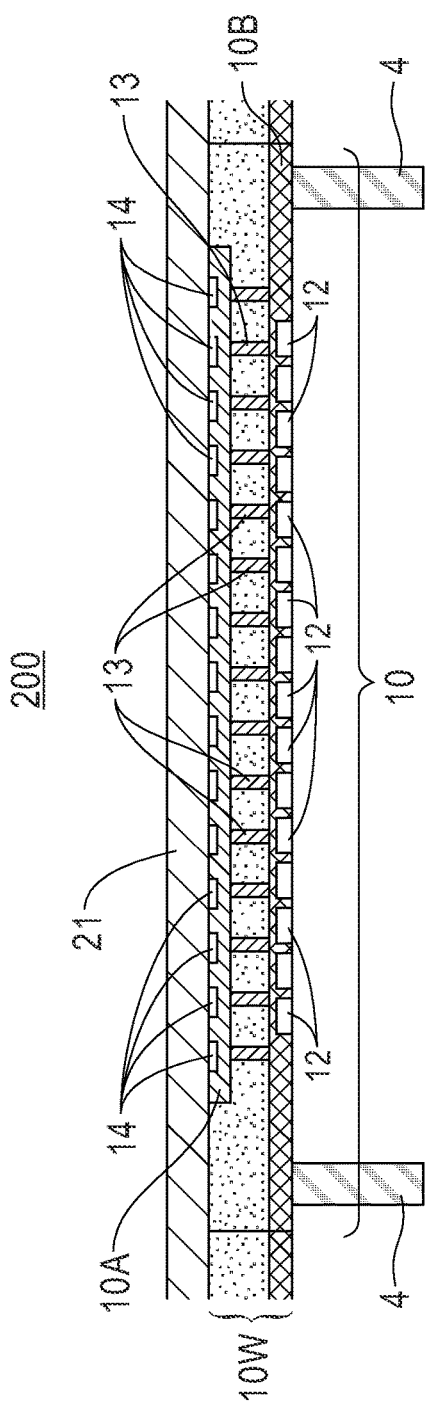
FIG. 2 is a cross-sectional view of a semiconductor structure after attaching a handler wafer to the device side of a translator chip and forming backside interconnect pads on the translator chip in accordance with another embodiment of the present invention.

FIG. 2 is a cross-sectional view of semiconductor structure 200 after attaching handler wafer 21 to the device side 10A of translator chip 10 in translator wafer 10W and after forming interconnect pads 12 on the backside 10B of translator chip 10 in translator wafer 10W in accordance with another embodiment of the present invention. As previously discussed, translator wafer 10W can be a portion of a wafer or a wafer. While only one translator chip 10 is depicted in FIG. 2, translator wafer 10W can include a number of translator chips 10. As depicted, FIG. 2 includes translator chip 10 in translator wafer 10W, TSVs 13, pillars 4 attached to backside 10B of translator chip 10, interconnect pads 12 under backside 10B of translator chip 10, device side 10A of translator chip 10 with interconnect pads 14 and the top surface (device side 10A) of translator chip 10 is attached to handler wafer 21. TSVs 13 connect backside 10B to device side 10A of translator chip 10.

In various embodiments, each translator chip 10 in translator wafer 10W is an active semiconductor device. As previously discussed, an active translator chip 10 can include semiconductor devices, such as memory controllers in device side 10A of translator chip 10. Translator chip 10 also includes TSVs 13 connecting device side 10A to backside 10B along with fanout and re-distribution wiring in backside 10B of translator chip 10. As previously discussed, in some embodiments, translator chip 10 is a passive chip using TSVs 13 with fanout and re-distribution wiring but, without active semiconductor devices.

After handler wafer 21 is attached, a thinning of translator wafer 10W occurs to reveal a top surface of TSVs 13 in each translator chip 10. After thinning translator wafer 10W, translator wafer 10W may have a thickness in the range of 50 to 100 um but, is not limited to these thicknesses. Grind side copper interconnect pads 12 may be formed on backside 10B of each translator chip 10 using known copper seed deposition, patterning, plating, and etch processes. Interconnect pads 12 formed on the exposed portions of TSVs 13 can be copper pads with typical diameters of 8 to 10 um. Interconnect pads 12 are not limited to this metal or pad size.

Pillars 4 may be formed along the perimeter of translator chip 10 using the copper seed and a second resist stencil and plating. After forming pillars 4, the copper seed may be removed with a flash etch process. For example, after plating, pillars 4 have a diameter of 30 to 90 um and a height of 40 to 130 um but, are not limited to these dimensions.

Figure 3:
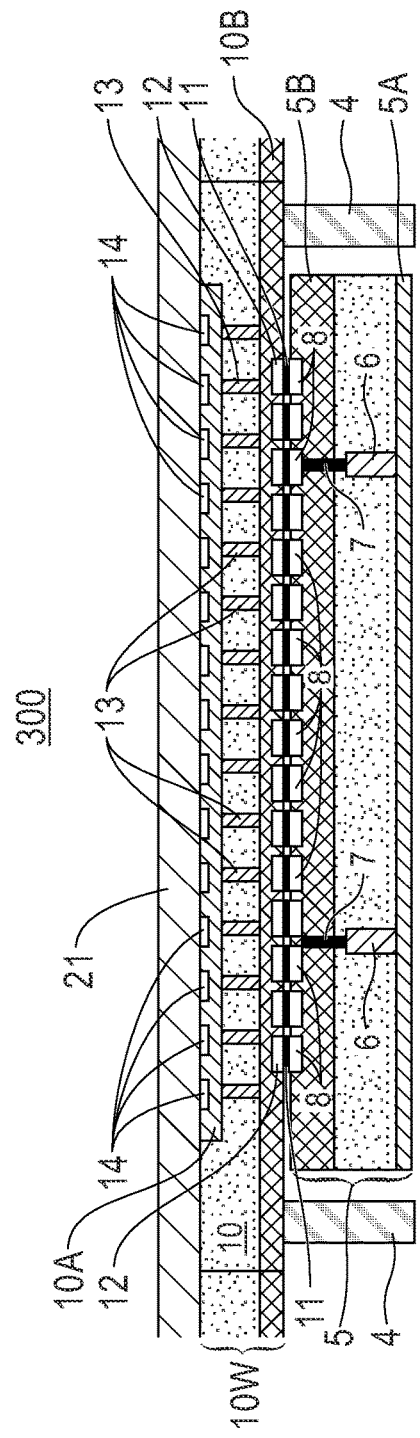
FIG. 3 is a cross-sectional view of the semiconductor structure after joining a logic chip to interconnect pads on the backside of the translator chip in accordance with an embodiment of the present invention.

FIG. 3 is a cross-sectional view of semiconductor structure 300 after joining logic chip 5 to interconnect pads 12 on backside 10B of translator chip 10 in accordance with an embodiment of the present invention. As previously discussed above, translator chip 10 is in translator wafer 10W for assembly of logic chip 5 to translator chip 10. As depicted, FIG. 3 includes logic chip 5 with interconnect pads 8 on backside 5B of logic chip 5, connections 11, interconnect pads 12 on backside 10B of translator chip 10 in the translator wafer 10W, pillar 4, TSVs 13, TSVs 7 in logic chip 5 connecting to vias 7, interconnect pads 14 on device side 10A of translator chip 10, and handler wafer 21. Using copper to copper, C4s, or copper hybrid connections for die to wafer bonds, interconnect pads 8 on backside 5B of logic chip 5 join to interconnect pads 12 on backside 10B of translator chip 10. A underfill material (not depicted) may be used between translator chip 10 and logic chip 5.

In various embodiments, logic chip 5 is thinned and diced before joining to each translator chip 10 in translator wafer 10W. As known to one skilled in the art, translator wafer 10W including a number of translator chips 10 and a number logic chips 5 attached to translator wafer 10W can also be known as a reconstituted wafer. In one embodiment, more than one logic chip 5 is joined to translator chip 10.

FIG. 4 is a cross-sectional view of semiconductor structure 400 after attaching handler wafer 41 to device side 5A of logic chip 5 and removing handler wafer 21 in accordance with an embodiment of the present invention. In various embodiments, handler wafer 41 attaches to one or more logic chips 5. For example, handler wafer 41 attaches to one or more logic chips 5 using known handler wafer attachment methods. In various embodiments, each logic chip 5 is joined to a single translator chip 10 in translator wafer 10W and device side 5A of each logic chip 5 attach to handler wafer 41. As depicted, FIG. 4 includes the elements of FIG. 3 except handler wafer 21 that is removed using known handler release processes and handler wafer 41 that is joined to logic chip 5. Releasing handler wafer 21 from device side 10A of translator chip 10 exposes interconnect pads 14 on the top surface of translator chip 10 in translator wafer 10W.

FIG. 5 is a cross-sectional view of semiconductor structure 500 after attaching device side 15A of memory chip 15 to the device side 10A of translator chip 10 in accordance with an embodiment of the present invention. As depicted, FIG. 5 includes the elements of FIG. 4 and memory chip 15 joined by connections 16 to translator chip 10 in translator wafer 10W. Memory chip 15 can be a full thickness, known good memory chip 15. In various embodiments, a number of memory chips 15 are joined to the same number of translator chips 10 in translator wafer 10W (e.g., one memory chip 15 attaches to one translator chip 10). In some embodiments, more than one memory chip 15 attaches to a single translator chip 10 as depicted in FIG. 7A.

Using one of known copper to copper pad bonding with thermal compression bonding (TCB), hybrid copper bonding that uses TCB with oxides and copper on each interconnect pad surface, or C4 soldering, device side 15A of memory chip 15 and device side 10A of translator chip 10 can be joined. For example, each translator chip 10 in translator wafer 10W can be joined to one memory chip 15 through connections 16 in a die to wafer bonding process. In some cases, a die underfill (not depicted), such as a nonconductive paste underfill is deposited and flows under memory chip 15.

Figure 6:
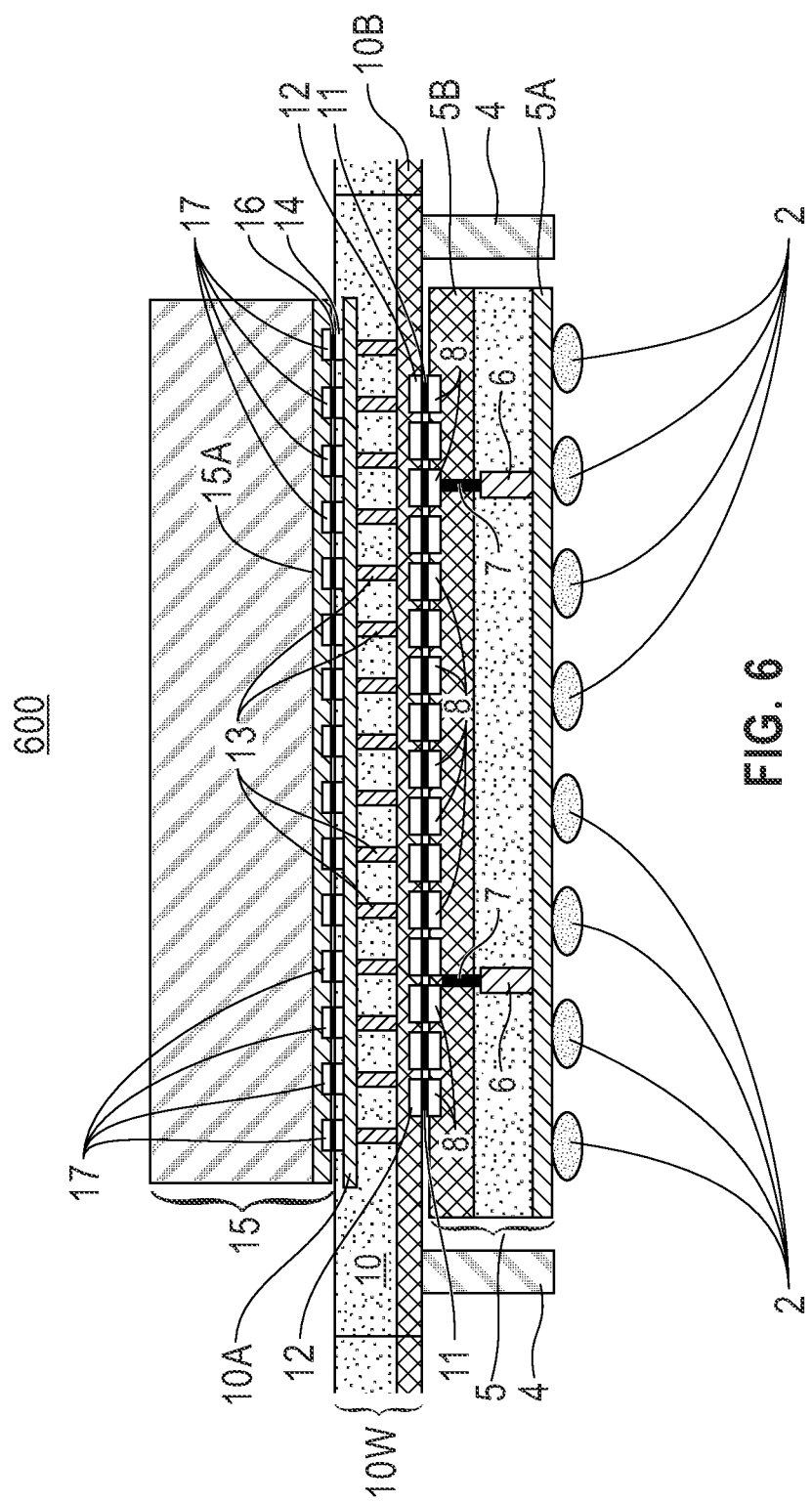
FIG. 6 is a cross-sectional view of the semiconductor structure after removing the second handler wafer on the logic chip and forming solder interconnects under the logic chip in accordance with an embodiment of the present invention.

FIG. 6 is a cross-sectional view of semiconductor structure 600 after removing handler wafer 41 on logic chip 5 and forming solder connections 2 under logic chip 5 in accordance with an embodiment of the present invention. As depicted, FIG. 6 includes solder connections 2 which can be C4s on device side 5A of logic chip 5, backside 5B of logic chip 5, interconnect pads 8, 12, 14, and 17, connections 11 and 16, pillars 4, TSVs 6, vias 7, TSVs 13 in translator chip 10, and memory chip 15 with device side 15A.

Releasing handler wafer 41 from device side 5A of logic chip 5 exposes the interconnect pads (not depicted) on device side 5A of logic chip 5. C4s or another solder bump for solder connections 2 can be deposited on device side 5A of logic chip 5. For example, 50 um C4s may be deposited on interconnect pads under logic chip 5. As previously discussed, solder connections 2 may be C4s formed by plating or C4s formed using the known solder ball drop technique with solder balls and screens.

In various embodiments, dicing of translator wafer 10W occurs to form one or more of translator chips 10. The dicing of translator wafer 10W can occur after depositing C4s for solder connections 2. FIG. 6 depicts semiconductor structure 600 before dicing translator wafer 10W to create translator chip 10. FIG. 1 depicts an example of a vertical multiple chip assembly formed from semiconductor structure 600 after dicing translator wafer 10W. Each translator chip 10 has at least one logic chip 5 and at least one memory chip 15 attached. The vertical stack of logic chip 5 under translator chip 10 with one or more memory chips 15 attached to the top of translator chip 10 can form an MCM after dicing translator wafer 10W. As previously discussed, translator chip 10 can be either an active chip, for example including memory controllers, TSVs 13, and fanout wiring for signals and power to memory chip 15, or a passive chip with TSVs 13 and fanout wiring for signals and power to memory chip 15. While FIG. 6 depicts a single memory chip 15 on translator chip 10, in other embodiments, more than one memory chip 15 can be joined to translator chip 10. In one embodiment (not depicted), a vertical stack of memory chips 15 is joined to translator chip 10.

Semiconductor structure 600 can be joined to a chip carrier substrate using solder connections 2 and solder connections 3 with known C4 and/or soldering processes for packaging substrate assembly (e.g., solder paste screening, module placement, and solder reflow to join logic chip 5 in the MCM module to the packaging substrate). As depicted in FIG. 1, the MCM created from semiconductor structure 600 after dicing translator wafer 10W can be attached to packaging substrate 1 which can be an organic packaging substrate or an inorganic packaging substrate (e.g., ceramic or silicon). Logic chip 5 in the MCM receives power directly from the packaging substrate through solder connections 2.

In some embodiments, underfill materials for connections 11, 16, and solder connections 2 are applied using known processes after attaching semiconductor structure 600 to the packaging substrate. A lid may be attached to the packaging substrate and to semiconductor structure 600 after translator wafer 10W dicing.

FIG. 7A is a cross-sectional view of semiconductor structure 700A of translator chip 80 over logic chip 75 and under memory chip 85 and under memory chip 90 in accordance with an embodiment of the present invention. As depicted, FIG. 7A includes packaging substrate 71, logic chip 75 with device side 75A and backside 75B, TSVs 76, vias 77, solder connections 72 and 73, pillar 74, translator chip 80 with device side 80A, backside 80B, and section 80R, TSVs 83, memory chip 85 with device side 85A, memory chip 90 with device side 90A, connections 81 joining logic chip 75 to translator chip 80, connections 86A joining translator chip 80 to memory chip 85, and connections 86B joining translator chip 80 to memory chip 90. As previously discussed with respect to FIG. 1, any number of TSVs 76 and vias 77 may be present in logic chip 75. In FIG. 7A, two horizontally placed memory chips (e.g., memory chip 85 and memory chip 90) reside on translator chip 80.

Connections 81 joining backside 75B of logic chip 75 to backside 80B of translator chip 80, connections 86A joining a portion of device side 80A of translator chip 80 to device side 85A of memory chip 85, and connections 86B joining a second portion of device side 80A of translator chip 80 to device side 90A of memory chip 90 can be formed using known die to wafer chip joining processes previously discussed with respect to FIG. 1 (e.g., copper to copper pad bonding, C4 joining, and hybrid copper bonding). Copper interconnect pads on each of logic chip 75, translator chip 80, and memory chips 85 and 90 are not depicted in FIGS. 7A and 7B.

Semiconductor structure 700A depicts one example of using translator chip 80 with active devices (e.g., memory controllers) or a passive translator chip 80 to form a multichip module using two horizontally aligned memory chips. In other examples, more than two horizontally aligned memory chips can be joined to translator chip 80, or more than two vertically aligned (not depicted) stacked memory chips can be joined to translator chip 80. As previously discussed, a chip underfill material (not depicted) may be used under one or more of the semiconductor chips in semiconductor structure 700A. This method of forming an MCM module is not limited to using two memory chips but, can be applied to three or more memory chips attached to translator chip 80.

Translator chip 80 includes a section 80R which is a center portion of translator chip 80 between memory chip 85 and memory chip 90. Section 80R of translator chip 80 is a portion of translator chip 80 between memory chips 85 and 90. In some embodiments, section 80R is removed from translator chip 80 as discussed later with respect to FIG. 7B.

FIG. 7B is a cross-sectional view of semiconductor structure 700B of translator chip 79 over logic chip 75 and under memory chip 85 and translator chip 82 above logic chip 75 and under memory chip 90 in accordance with an embodiment of the present invention. As depicted, FIG. 7B includes the elements of FIG. 7A except for section 80R in translator chip 80 of FIG. 7A that is removed forming translator chip 79 and translator chip 82 in FIG. 7B (e.g., 80R can be removed during the dicing of translator chip 80) and heatsink 70 with thermal interface material 122. When section 80R in FIG. 7A is removed from translator chip 80, two translator chips can be formed. In FIG. 7B, the two translator chips formed from translator chip 80 after dicing out section 80R include translator chip 79 with device side 79A and backside 79B and translator chip 82 with device side 82A and backside 82B.

Each of translator chips 79 and 82 formed from translator chip 80 includes TSVs 13, fanout wiring, pillars 74 outside of logic chip 75, and optional active devices connecting to one of memory chip 85 or memory chip 90. For example, translator chip 79 would be formed from the portion of translator chip 80 that includes connections 86A to memory chip 85, and translator chip 82 formed from translator chip 80 can have connections 86B to memory chip 90.

As known to one skilled in the art, using a variation of the methods of forming an MCM previously discussed with respect to FIGS. 2-6, after joining memory chips 85 and 90 to translator chip 80, releasing the second handler wafer under logic chip 75, and after depositing solder connections 72 or C4s under logic chip 75, the dicing of translator chip 80 includes removing section 80R between memory chip 85 and 90. Once section 80R is removed, translator chip 79 and translator chip 82 can be formed from translator chip 80.

The removal of section 80R exposes a portion of the surface of backside 75B of logic chip 75 for connection with heatsink 70. For example, the connection to heatsink 70 or a lid (not depicted) can occur with a known thermally conductive material, such as thermal interface material 122. Exposing a portion of backside 75B of logic chip 75 allows for the removal of some of the heat or thermal energy generated by logic chip 75 through heatsink 70.

FIG. 8 is a cross-sectional view of semiconductor structure 800 in accordance with an embodiment of the present invention. As depicted, FIG. 8 includes a multichip module similar to or essentially the same as the multichip module of FIG. 1 except for the addition of thermal TSVs 13T, lid 110, heatsink 120, thermal interface materials 121 and 122. As depicted, the multichip module is attached to packaging substrate 1 and lid 110 with heatsink 120 using thermal interface materials 121 and 122. The multichip module in FIG. 8 includes memory chip 15 with device side 15A joining by connections 16 to device side 10A of translator chip 10 with TSVs 13, and backside 10B of translator chip 10 joining by connections 11 to backside 55B of logic chip 55 which joins on device side 55A to packaging substrate 1. As depicted, the multichip module of FIG. 8 is essentially the same or similar to the multichip module of FIG. 1 except for the addition of and TSV 13T (optional) and lid 111 over the multichip module. As depicted, FIG. 8 includes lid 111 thermally connecting to heatsink 120 by thermal interface material 121, memory chip 15 and translator chip 10 connecting to lid 111 by thermal interface material 122, packaging substrate 81, memory chip 15, translator chip 10 with pillars 4 and TSVs 13, TSV 13T, logic chip 5 with TSVs 6, vias 7, device side 15A of memory chip 15 with connections 16 to device side 10A of translator chip 10, backside 10B of translator chip 10 with connections 11 backside 5B of logic chip 5, and solder connections 2 under logic chip 5 connecting device side 5A to packaging substrate 81, and solder connections 3 joining pillar 4 on backside 10B of translator chip 10 to packaging substrate 81.

Memory chip 15 is essentially the same as memory chip 15 in FIG. 1. Translator chip 10 and logic chip 5 are similar to or essentially the same as translator chip 10 and logic chip 5 in FIG. 1 except for the addition of TSV 13T in translator chip 10. While one TSV 13T is depicted, in other examples, more than one TSV 13T may be present. TSVs 13T reside outside of TSV 13 in translator chip 10 and outside of connections to signal and power to memory chip 15 and logic chip 55. TSVs 13T can reside around the periphery of translator chip 10 (e.g., inside of pillar 4 and outside of connections to memory chip 15). TSVs 13T may be under a portion of thermal interface material 122 contacting lid 110. In other examples, TSVs 13T may be under a portion of a thermal interface material that directly contacts a heatsink that replaces lid 110. TSVs 13T (optional) provides an additional path for thermal transfer of heat away from logic chip 55 through TSV 13T in translator chip 10 and thermal interface material 122 to lid 110 and thermal interface material 121 to heatsink 120.

Thermal interface materials 121 and 122 can be any known thermally conductive material used in semiconductor modules for transferring thermal energy from a semiconductor chip to a lid and/or a heatsink. Lid 110 may be mechanically attached to packaging substrate 81 by adhesive or a fastener (not depicted) and lid 110 may be mechanically attached by a fastener (not depicted) to heatsink 120. FIG. 8 depicts one example of attaching a heatsink and a lid in semiconductor structure 800, in other examples, a lid and/or heatsink can be attached to semiconductor structure 700B depicted in FIG. 7B with more than one memory chip.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A multichip module with a vertical chip stack of a logic chip, a translator chip, and at least one memory chip, the multichip module comprising:
   a logic chip connecting to a packaging substrate and a translator chip; and
   the translator chip with one or more active semiconductor devices directly connecting the logic chip to at least one memory chip by through silicon vias in the translator chip.

2. The multichip module of claim 1, wherein the translator chip includes fanout wiring to the through silicon vias vertically connecting to the logic chip and the at least one memory chip.

3. The multichip module of claim 1, wherein the translator chip includes copper pillars attached on a periphery of the translator chip connecting to a packaging substrate.

4. The multichip module of claim 3, wherein the copper pillars attached along the periphery of the backside of the translator chip connecting to the packaging substrate provides power from the packaging substrate to the at least one memory chip through the translator chip.

5. The multichip module of claim 1, wherein the translator chip includes one or more through silicon vias in an outer portion of the translator chip that removes heat from the logic chip.

6. The multichip module of claim 1, wherein the logic chip is an accelerator chip.

7. The multichip module of claim 2, wherein the active semiconductor devices include one or more memory controllers.

8. The multichip module of claim 1, wherein the translator chip with the one or more active semiconductor devices above and vertically connecting to the logic chip and the at least one memory chip connect by at least one connection selected from the group consisting of: a copper pad to copper pad thermal compression bond, a hybrid copper pad thermal compression bond, or a controlled chip collapse connection.

9. The multichip module of claim 3, wherein power is provided to the at least one memory chip from a package substrate through the translator chip.

10. The multichip module of claim 1, wherein the translator chip above and vertically connecting to the logic chip and the at least one memory chip further comprises a backside of the translator chip connecting to a backside of the logic chip and a device side of the at least one memory chip connecting to a device side of the translator chip.

11. The multichip module of claim 1, further comprising:
   solder bumps on a device side of the logic chip;
   a packaging substrate connecting to the solder bumps on the device side of the logic chip; and
   a lid over the at least one memory chip and the translator chip over the logic chip, wherein the lid is attached to a heatsink.

12. A multichip module with a vertical stack of a logic chip, two translator chips, and two memory chips, the multichip module comprising:
   a logic chip connecting to a packaging substrate;
   two translator chips above and vertically connecting to the logic chip;
   and
   two memory chips, wherein each memory chip of the two memory chips is above and vertically connecting to one of the two translator chips.

13. The multichip module of claim 1, wherein the translator chip includes one or more thermal through silicon vias directly under a portion of a thermal interface material that directly contacts a heatsink.

14. The multichip module of claim 12, wherein the two translator chips further comprise a portion of a backside of the logic chip between the two translator chips is exposed, and wherein one or more pillars connect each of the two translator chips to a memory chip of the two memory chips.

15. The multichip module of claim 14, wherein a lid and a heatsink are attached to the exposed portion of the backside of the logic chip and to a top surface of each of the two translator chips.

16. A method of forming a multichip module with a vertical stack of three semiconductor chips, the method comprising:
   attaching a first handler wafer to a device side of a translator wafer;
   joining each logic chip of a number of logic chips to each translator chip of a number of translator chips in the translator wafer;
   attaching a second handler wafer to a device side of the number of logic chips;
   releasing the first handler wafer;
   joining each translator chip of the number of translator chips in the translator wafer to a memory chip of a number of memory chips;
   releasing the second handler wafer; and
   forming solder bumps on a backside of logic chip.

17. The method of claim 16, further comprising dicing the translator wafer into the number of translator chips, wherein each translator chip of the number of translator chips is attached to the logic chip of the number of logic chips and the memory chip of the number of memory chips to form a multichip module.

18. The method of claim 16, wherein attaching the first handler wafer to the device side of the translator wafer further comprises:
- thinning the translator wafer;
- forming interconnection pads on a backside of the translator wafer; and
- forming copper pillars along a periphery of the translator wafer.

19. The method of claim 16, wherein joining each translator chip of the number of translator chips in the translator wafer to the memory chip of the number of memory chips further comprises:
- forming connections between interconnect pads on the device side of the translator wafer and interconnect pads on a device side of a memory chip, wherein the connections are selected from the group consisting of: a copper pad to copper pad connection, a hybrid copper pad connection, or a controlled collapse chip connection.

20. The method of claim 17, further comprises:
- attaching the logic chip of the number of logic chips to a packaging substrate using the solder bumps on the backside of the logic chip.

\* \* \* \* \*